US009576805B2

(12) United States Patent
Ramaswamy et al.

(10) Patent No.: US 9,576,805 B2
(45) Date of Patent: *Feb. 21, 2017

(54) FORTIFICATION OF CHARGE-STORING MATERIAL IN HIGH-K DIELECTRIC ENVIRONMENTS AND RESULTING APPARATUSES

(71) Applicant: Micron Technology, Inc., Boise, ID (US)

(72) Inventors: D. V. Nirmal Ramaswamy, Boise, ID (US); Matthew N. Rocklein, Boise, ID (US); Rhett T. Brewer, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/667,385

(22) Filed: Mar. 24, 2015

(65) Prior Publication Data
US 2015/0200101 A1 Jul. 16, 2015

Related U.S. Application Data

(60) Division of application No. 13/615,030, filed on Sep. 13, 2012, now Pat. No. 8,987,806, which is a
(Continued)

(51) Int. Cl.
*G11C 11/56* (2006.01)
*H01L 29/792* (2006.01)
(Continued)

(52) U.S. Cl.
CPC ........ *H01L 21/28282* (2013.01); *B82Y 10/00* (2013.01); *G11C 11/5671* (2013.01);
(Continued)

(58) Field of Classification Search
CPC . H01L 27/1052; H01L 29/788; H01L 29/792; H01L 29/66833; H01L 21/28282; H01L 29/42348; G11C 11/5671
See application file for complete search history.

(56) References Cited

U.S. PATENT DOCUMENTS 6,297,095 B1 10/2001 Muralidhar et al.
6,310,376 B1 10/2001 Ueda et al.
(Continued)

FOREIGN PATENT DOCUMENTS

TW 200518225 6/2005

OTHER PUBLICATIONS

Aarik et al., Phase Transformations in Hafnium Dioxide Thin Films Grown by Atomic Layer Deposition at High Temperatures, Applied Surface Science, vol. 173, 2001, pp. 15-21.
(Continued)

*Primary Examiner* — Evan Pert
(74) *Attorney, Agent, or Firm* — TraskBritt

(57) ABSTRACT

Memories, systems, and methods for forming memory cells are disclosed. One such memory cell includes a charge storage node that includes nanodots over a tunnel dielectric and a protective film over the nanodots. In another memory cell, the charge storage node includes nanodots that include a ruthenium alloy. Memory cells can include an inter-gate dielectric over the protective film or ruthenium alloy nanodots and a control gate over the inter-gate dielectric. The protective film and ruthenium alloy can be configured to protect at least some of the nanodots from vaporizing during formation of the inter-gate dielectric.

20 Claims, 8 Drawing Sheets

Related U.S. Application Data continuation of application No. 12/728,697, filed on Mar. 22, 2010, now Pat. No. 8,288,811.

(51) Int. Cl.

| | | |
|---|---|---|
| *H01L 21/336* | (2006.01) | |
| *H01L 21/28* | (2006.01) | |
| *B82Y 10/00* | (2011.01) | |
| *H01L 21/02* | (2006.01) | |
| *H01L 29/423* | (2006.01) | |

(52) U.S. Cl.
CPC .... *H01L 21/0228* (2013.01); *H01L 21/02148* (2013.01); *H01L 21/02323* (2013.01); *H01L 21/28273* (2013.01); *H01L 29/42332* (2013.01); *H01L 29/42348* (2013.01)

(56) References Cited

U.S. PATENT DOCUMENTS

| | | | |
|---|---|---|---|
| 6,461,909 B1 | 10/2002 | Marsh et al. | |
| 6,737,313 B1 | 5/2004 | Marsh et al. | |
| 6,803,272 B1 | 10/2004 | Halliyal et al. | |
| 6,927,136 B2 | 8/2005 | Lung et al. | |
| 7,005,697 B2 | 2/2006 | Batra et al. | |
| 7,053,445 B1 | 5/2006 | Suh et al. | |
| 7,112,485 B2 | 9/2006 | Vaartstra | |
| 7,199,023 B2 | 4/2007 | Ahn et al. | |
| 7,355,238 B2 | 4/2008 | Takata et al. | |
| 7,382,017 B2 | 6/2008 | Duan et al. | |
| 7,485,551 B2 | 2/2009 | Hebras | |
| 7,510,931 B2 | 3/2009 | Park et al. | |
| 7,560,769 B2 | 7/2009 | Sandhu et al. | |
| 7,564,094 B2 | 7/2009 | Kim et al. | |
| 7,572,695 B2 | 8/2009 | Ahn et al. | |
| 7,575,978 B2 | 8/2009 | Kraus et al. | |
| 7,582,549 B2 | 9/2009 | Ahn et al. | |
| 7,588,988 B2 | 9/2009 | Ahn et al. | |
| 7,602,030 B2 | 10/2009 | Ahn et al. | |
| 7,989,290 B2 | 8/2011 | Marsh et al. | |
| 8,030,161 B2 | 10/2011 | Duan et al. | |
| 8,071,453 B1 | 12/2011 | Ramkumar et al. | |
| 8,093,128 B2 | 1/2012 | Koutny, Jr. et al. | |
| 8,114,735 B2 | 2/2012 | Kim et al. | |
| 8,143,129 B2 | 3/2012 | Ramkumar et al. | |
| 8,163,660 B2 | 4/2012 | Puchner et al. | |
| 8,269,268 B2 | 9/2012 | Huo et al. | |
| 8,283,261 B2 | 10/2012 | Ramkumar | |
| 8,288,811 B2 * | 10/2012 | Ramaswamy | B82Y 10/00 257/314 |
| 8,314,456 B2 | 11/2012 | Marsh et al. | |
| 8,318,608 B2 | 11/2012 | Ramkumar et al. | |
| 8,530,954 B2 | 9/2013 | Kim et al. | |
| 8,597,997 B2 * | 12/2013 | Ivanova-Hristova | B82Y 10/00 257/E21.209 |
| 8,614,124 B2 | 12/2013 | Jenne et al. | |
| 8,823,075 B2 * | 9/2014 | Purayath | H01L 21/28273 257/321 |
| 9,029,936 B2 * | 5/2015 | Purayath | H01L 29/66825 257/314 |
| 9,331,181 B2 * | 5/2016 | Lee | H01L 29/66825 |
| 2005/0258467 A1 | 11/2005 | Wang et al. | |
| 2005/0272238 A1 | 12/2005 | Phillips et al. | |
| 2006/0014329 A1 | 1/2006 | Park et al. | |
| 2006/0081911 A1 | 4/2006 | Batra et al. | |
| 2006/0125030 A1 | 6/2006 | Ahn et al. | |
| 2006/0234517 A1 | 10/2006 | Yeo et al. | |
| 2006/0261441 A1 | 11/2006 | Marsh et al. | |
| 2007/0014919 A1 | 1/2007 | Hamalainen et al. | |
| 2007/0026621 A1 | 2/2007 | Cho et al. | |
| 2007/0048953 A1 | 3/2007 | Gealy et al. | |
| 2007/0054502 A1 | 3/2007 | Seol et al. | |
| 2007/0108505 A1 * | 5/2007 | Seol | B82Y 10/00 257/316 |
| 2007/0164572 A9 | 7/2007 | Pratt et al. | |
| 2008/0035983 A1 | 2/2008 | Sandhu et al. | |
| 2008/0121976 A1 | 5/2008 | Sandhu et al. | |
| 2008/0135914 A1 | 6/2008 | Krishna et al. | |
| 2008/0142878 A1 | 6/2008 | Choi et al. | |
| 2008/0150009 A1 | 6/2008 | Chen | |
| 2008/0246078 A1 | 10/2008 | Huo et al. | |
| 2008/0274615 A1 | 11/2008 | Vaartstra | |
| 2008/0296664 A1 | 12/2008 | Ramkumar et al. | |
| 2009/0001443 A1 | 1/2009 | Krishnamohan et al. | |
| 2009/0011585 A1 * | 1/2009 | Marsh | B82Y 10/00 438/591 |
| 2009/0039417 A1 * | 2/2009 | Chen | B82Y 10/00 257/326 |
| 2009/0045447 A1 | 2/2009 | Ramaswamy et al. | |
| 2009/0090952 A1 * | 4/2009 | Olsen | H01L 21/28273 257/314 |
| 2009/0097320 A1 | 4/2009 | Min et al. | |
| 2009/0152621 A1 | 6/2009 | Polishchuk et al. | |
| 2009/0159955 A1 | 6/2009 | Lee et al. | |
| 2009/0191676 A1 | 7/2009 | Forbes | |
| 2009/0212351 A1 | 8/2009 | Chen | |
| 2009/0215255 A1 * | 8/2009 | Millward | B22F 1/0022 438/591 |
| 2009/0263962 A1 | 10/2009 | Sandhu et al. | |
| 2009/0283817 A1 | 11/2009 | Krishnamohan et al. | |
| 2009/0302371 A1 | 12/2009 | Kraus et al. | |
| 2010/0109074 A1 | 5/2010 | Seol et al. | |
| 2010/0123222 A1 * | 5/2010 | Ivanova-Hristova | B82Y 10/00 257/632 |
| 2010/0276747 A1 * | 11/2010 | Lee | B82Y 10/00 257/325 |
| 2011/0006358 A1 | 1/2011 | Lee et al. | |
| 2011/0180865 A1 | 7/2011 | Ramaswamy | |
| 2013/0001673 A1 | 1/2013 | Ramaswamy et al. | |
| 2013/0175604 A1 | 7/2013 | Polishchuk et al. | |
| 2013/0178030 A1 | 7/2013 | Ramkumar et al. | |
| 2013/0178031 A1 | 7/2013 | Ramkumar et al. | |
| 2013/0210209 A1 | 8/2013 | Ramkumar | |
| 2013/0307052 A1 | 11/2013 | Jenne et al. | |
| 2013/0309826 A1 | 11/2013 | Ramkumar et al. | |

OTHER PUBLICATIONS

Aarik et al., Influence of Substrate Temperature on Atomic Layer Growth and Properties of HfO2 Thin Films, Thin Solid Films, vol. 340, 1999, pp. 110-116.

Akasaka et al., Material Selection for the Metal Gate/High-k Transistors, Extended Abstracts of the 2004 International Conference on Solid State Devices and Materials, Tokyo, 2004, pp. 196-197.

Alshareef et al., Thermally Stable N-Metal Gate MOSFETs Using La-Incorporated HfSiO Dielectric, 2006 Symposium on VLSI Technology Digest of Technical Papers, IEEE, 2006, 2 pages.

Conley, Jr. et al., Atomic Layer Deposition of Hafnium Oxide Using Anhydrous Hafnium Nitrate, Electrochemical and Solid-State Letters, vol. 5, No. 5, 2002, pp. C57-C59.

Hirano et al., High Performance nMOSFET with HfSix/HfO2 Gate Stack by Low Temperature Process, IEEE, 2005, pp. 911-914.

International Preliminary Report on Patentability for International Application No. PCT/US2011/028954 dated Sep. 25, 2012, 10 pages.

International Search Report, International Application No. PCT/US2011/028954, mailed Oct. 31, 2011, four (4) pages.

International Written Opinion of the International Searching Authority, International Application No. PCT/US2011/028954, mailed Oct. 31, 2011, nine (9) pages.

Ramaswamy et al., Memory Cells, Methods of Forming Dielectric Materials, and methods of Forming Memory Cells, U.S. Appl. No. 12/351,099, filed Jun. 30, 2008.

Takahashi et al., High Mobility Dual Metal Gate MOS Transistors with High-k Gate Dielectrics, Extended Abstracts of the 2004 International Conference on Solid State Devices and Materials, Tokyo, 2004, pp. 22-23.

* cited by examiner

FORTIFICATION OF CHARGE-STORING MATERIAL IN HIGH-K DIELECTRIC ENVIRONMENTS AND RESULTING APPARATUSES

CROSS-REFERENCE TO RELATED APPLICATIONS

This application is a divisional of U.S. patent application Ser. No. 13/615,030, filed Sep. 13, 2012, now U.S. Pat. No. 8,987,806, issued Mar. 24, 2015, which application is a continuation of U.S. patent application Ser. No. 12/728,697, filed Mar. 22, 2010, now U.S. Pat. No. 8,288,811, issued Oct. 16, 2012, the disclosure of each of which is hereby incorporated herein in its entirety by this reference.

TECHNICAL FIELD

The present disclosure relates generally to integrated circuit devices, and more particularly, to forming charge-storing structures in semiconductor devices.

BACKGROUND

Integrated circuits are interconnected networks of electrical components fabricated on a common foundation called a substrate. The electrical components are typically fabricated on a wafer of semiconductor material that serves as a substrate. Various fabrication techniques, such as layering, doping, masking, and etching, are used to build millions of resistors, transistors, and other electrical components on the wafer. The components are then wired together, (i.e., interconnected) to define a specific electrical circuit, such as a processor or a memory device.

There is a general desire to reduce the sizes of the various components in integrated circuit fabrication. Reducing size is generally accompanied by a reduction in cost, as more and more devices can be fabricated on a single substrate, and a reduction in power requirements, as less power is needed to switch smaller components. However, this size reduction does not come without a cost. As integrated circuit devices become smaller and smaller, charge leakage and parasitic capacitance between components become increasingly problematic. An example of the detrimental impact of charge leakage and parasitic capacitance can be seen in Flash memory devices.

Flash memory devices are one particular class of memory devices that have developed into a popular source of non-volatile memory for a wide range of electronic applications. Non-volatile memory is memory that can retain its data for an extended period without the application of power. Flash memory devices typically use a one-transistor memory cell that allows for high memory densities, high reliability, and low power consumption. Changes in threshold voltage of the cells, through programming of a charge storage node, such as a floating gate, trapping layers, or other physical phenomena, determine the data state of each cell. By defining two or more ranges of threshold voltages to each correspond to individual data states, one or more bits of information may be stored in each cell. Common uses for Flash memory and other non-volatile memory include personal computers, personal digital assistants (PDAs), digital cameras, digital media players, digital recorders, games, appliances, vehicles, wireless devices, mobile telephones, and removable memory modules. The uses for non-volatile memory continue to expand to cover more devices and larger amounts of memory.

For a Flash memory device utilizing floating-gate memory cells, where a level of charge stored on the floating-gate affects its threshold voltage, a reduction in size means less volume for charge storage. If the same material were used for the floating gates of two differently sized memory cells, the smaller memory cell would be capable of storing less charge. As a result, the smaller memory cell will have a smaller difference in its possible threshold voltages relative to the larger memory cell. Furthermore, any charge leakage, such as stress-induced gate leakage, would have a larger impact on the threshold voltage of the smaller memory cell. In addition, due to parasitic capacitive coupling to floating gates of adjacent memory cells, more margin may be required to avoid a false reading of the data state of the memory cell. Compensating for leakage and parasitic capacitance concerns with a smaller range of threshold voltages makes it increasingly difficult to distinguish between differing data states of smaller memory cells.

The inventors have appreciated that for the reasons stated above, and for other reasons that will become apparent to those skilled in the art upon reading and understanding the present specification, there is a need in the art for alternative structures and their processes in the formation of integrated circuit devices.

BRIEF DESCRIPTION OF THE DRAWINGS

In the drawings, which illustrate embodiments of the invention.

DETAILED DESCRIPTION

Figure 1:
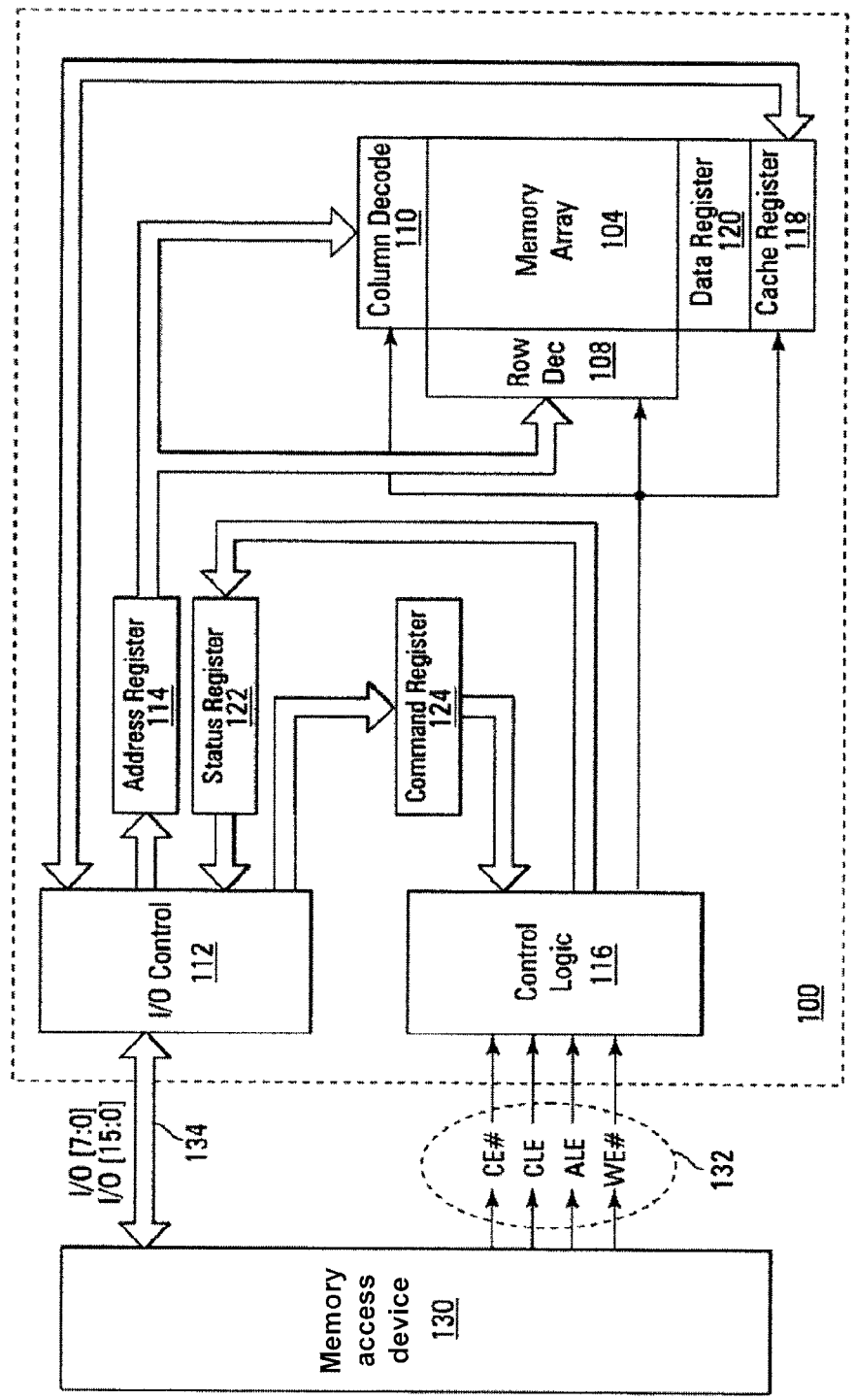
FIG. 1 is a simplified block diagram of a memory device coupled to a processor as part of an electronic system, according to an embodiment of the disclosure.

In the following detailed description, reference is made to the accompanying drawings that form a part hereof, and in which is shown by way of illustration specific embodiments in which the invention may be practiced. These embodiments are described in sufficient detail to enable those of ordinary skill in the art to practice the invention, and it is to be understood that other embodiments may be utilized, and that process, chemical, structural, logical, and electrical changes may be made within the scope of the present invention.

In this description, circuits and functions may be shown in block diagram form in order not to obscure the present invention in unnecessary detail. Furthermore, specific circuit implementations shown and described are only examples and should not be construed as the only way to implement the present invention unless specified otherwise herein. Block definitions and partitioning of logic between various blocks represent a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

The terms "wafer" and "substrate" are to be understood as a semiconductor-based material including silicon, silicon-on-insulator (SOI) or silicon-on-sapphire (SOS) technology, thin film transistor (TFT) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. The semiconductor need not be silicon-based, but may be based on silicon-germanium, silicon-on-insulator, silicon-on-sapphire, germanium, or gallium arsenide, among others. In addition, directional references, e.g., upper, lower, top, bottom and sides, are relative to one another and need not refer to an absolute direction.

It should be understood that any reference to an element herein using a designation such as "first," "second," and so forth, does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Also, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process is terminated when its acts are completed.

FIG. 1 is a simplified block diagram of a memory device 100, as one example of an integrated circuit device, in communication with (e.g., coupled to) a memory access device 130 as part of an electronic system, according to an embodiment of the disclosure. Some examples of electronic systems include personal computers, personal digital assistants (PDAs), digital cameras, digital media players, digital recorders, games, appliances, vehicles, wireless devices, cellular telephones, and the like. The memory access device 130 may be any device configured for accessing the memory device, such as, for example a memory controller or processor.

The memory device 100 includes an array of memory cells 104 arranged in rows and columns. The memory device 100, memory access device 130, or a combination thereof can include charge-storage structures formed in accordance with an embodiment of this disclosure. In a non-volatile memory embodiment, the array of memory cells 104 may include memory cells having a charge storage node in accordance with an embodiment of this disclosure. Although various embodiments will be described primarily with reference to NAND memory arrays, the various embodiments are not limited to a specific architecture of the memory cell array 104. Some examples of other array architectures suitable for the present embodiments include NOR arrays, AND arrays, and virtual ground arrays.

A row decode circuitry 108 and a column decode circuitry 110 are provided to decode address signals. Address signals are received and decoded to access the memory cell array 104. The memory device 100 also includes input/output (I/O) control circuitry 112 to manage input of commands, addresses, and data to the memory device 100 as well as output of data and status information from the memory device 100. An address register 114 is coupled between the I/O control circuitry 112 and the row decode circuitry 108 and the column decode circuitry 110 and may latch the address signals prior to decoding. A command register 124 is coupled between the I/O control circuitry 112 and control logic 116 to latch incoming commands. The control logic 116 controls access to the memory array 104 in response to the commands and generates status information for the memory access device 130. The control logic 116 controls the row decode circuitry 108 and the column decode circuitry 110 in response to values of the command register 124 and values of a control link 132.

Control logic 116 may be coupled to a cache register 118. The cache register 118 latches data, either incoming or outgoing, as directed by the control logic 116 to temporarily store data while the memory array 104 is busy writing or reading, respectively, other data. During a write operation, data is passed from the cache register 118 to a data register 120 for transfer to the memory cell array 104. New data may be latched in the cache register 118 from the I/O control circuitry 112. During a read operation, new data may be passed from the data register 120 to the cache register 118. The new data then may be passed from the cache register 118 to the I/O control circuitry 112 for output to the memory access device 130. The. A status register 122 is coupled between the I/O control circuitry 112 and the control logic 116 to latch status information for output to the memory access device 130.

The memory device 100 receives control signals at the control logic 116 from the memory access device 130 over the control link 132. As non-limiting examples, the control signals may include a chip enable CE#, a command latch enable CLE, an address latch enable ALE, and a write enable WE#. The memory device 100 receives commands (in the form of command signals), addresses (in the form of address signals), and data (in the form of data signals) from the memory access device 130 over a multiplexed I/O bus 134 and outputs data to the memory access device 130 over the I/O bus 134.

Specifically, the commands may be received over I/O pins [7:0] of the I/O bus 134 at the I/O control circuitry 112 and are written into the command register 124. The addresses may be received I/O pins [7:0] of the I/O bus 134 at the I/O control circuitry 112 and are written into the address register 114. The data may be received over I/O pins [7:0] for an 8-bit device or I/O pins [15:0] for a 16-bit device at the I/O control circuitry 112 and are written into the cache register 118. The data are subsequently written into the data register 120 for programming the memory array 104. For another embodiment, the cache register 118 may be omitted, and the data may be written directly into the data register 120. Also, data may be output over I/O pins [7:0] for an 8-bit device or I/O pins [15:0] for a 16-bit device. It will be appreciated by those skilled in the art that additional circuitry and signals can be provided and that the memory device 100 of FIG. 1 has been simplified to help focus on the present disclosure.

While FIG. 1 has been described in accordance with popular conventions for receipt and output of the various signals, it is noted that the various embodiments are not limited by the specific signals and I/O configurations described unless expressly noted herein.

Figure 2:
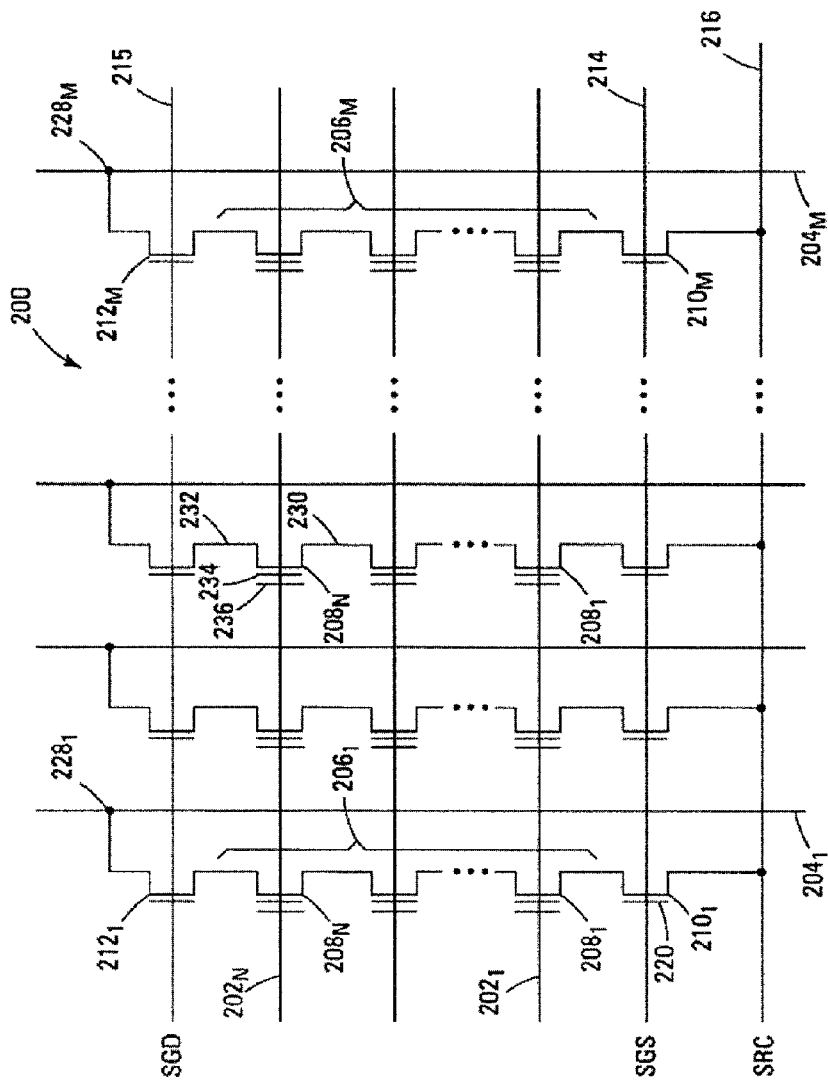
FIG. 2 is a simplified schematic of a NAND memory array as might be found in the memory array of FIG. 1.

FIG. 2 is a schematic of a NAND memory array 200 as might be found in the memory array 104 of FIG. 1 in accordance with another embodiment of the disclosure. As shown in FIG. 2, the NAND memory array 200 includes access lines, (e.g., word lines) $202_1$ to $202_N$ and intersecting digit lines (e.g., bit lines) $204_1$ to $204_M$. For ease of addressing in the digital environment, the number of access lines 202 and the number of digit lines 204 typically are each some power of two.

The NAND memory array 200 includes NAND strings $206_1$ to $206_M$. Each NAND string includes charge-storage transistors $208_1$ to $208_N$. The charge-storage transistors 208 represent non-volatile memory cells for storage of data. The charge-storage transistors 208 of each NAND string 206 are connected in series source to drain between a source select gate 210 (e.g., a field-effect transistor (FET)), and a drain select gate 212 (e.g., an FET).

A source of each source select gate 210 is connected to a common source line 216. The drain of each source select gate 210 is connected to the source of the first charge-storage transistor 208 of the corresponding NAND string 206. For example, the drain of source select gate $210_1$ is connected to the source of transistor $208_1$ of the corresponding NAND string $206_1$. A control gate 220 of each source select gate 210 is connected to source select line 214. If multiple source select gates 210 are utilized for a given NAND string 206, they could be coupled in series between the common source line 216 and the first charge-storage transistor $208_1$ of that NAND string 206.

The drain of each drain select gate 212 is connected to a digit line 204 for the corresponding NAND string at a drain contact 228. For example, the drain of drain select gate $212_1$ is connected to the bit line $204_1$ for the corresponding NAND string $206_1$ at drain contact $228_1$. The source of each drain select gate 212 is connected to the drain of the last charge-storage transistor 208 of the corresponding NAND string 206. For example, the source of drain select gate $212_1$ is connected to the drain of transistor $208_N$ of the corresponding NAND string $206_1$. If multiple drain select gates 212 are utilized for a given NAND string 206, they could be coupled in series between the corresponding digit line 204 and the last floating-gate transistor $208_N$ of that NAND string 206.

Typical construction of charge-storage transistors 208 includes a source 230 and a drain 232, a charge storage node 234, and a control gate 236, as shown in FIG. 2. The charge-storage transistors 208 can be formed in accordance with one or more of the various embodiments discussed herein. Charge-storage transistors 208 have the control gates 236 coupled to an access line 202. A column of the charge-storage transistors 208 are those NAND strings 206 coupled to a given local digit line 204. A row of the charge-storage transistors 208 are those transistors commonly coupled to a given access line 202.

Figure 3:
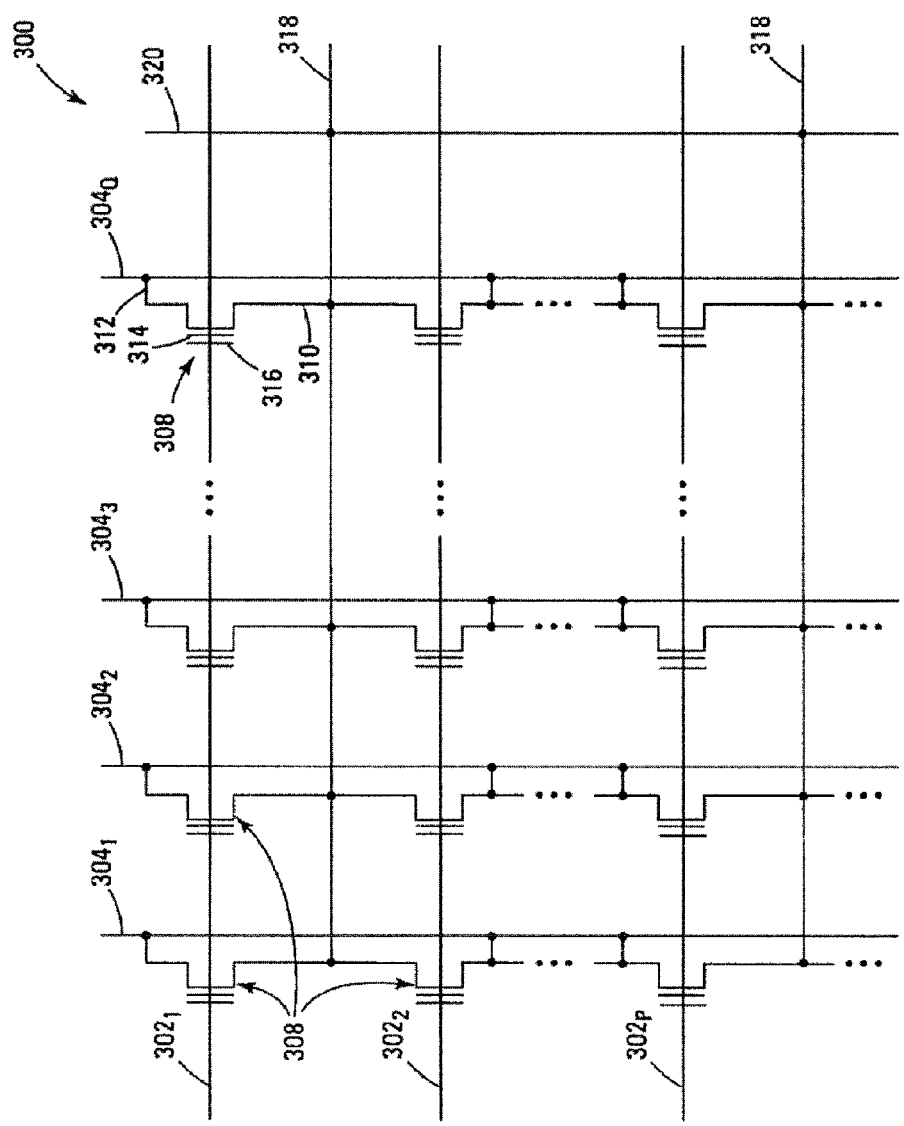
FIG. 3 is a simplified schematic of a NOR memory array as might be found in the memory array of FIG. 1.

FIG. 3 is a schematic of a NOR memory array 300 as might be found in the memory array 104 of FIG. 1 in accordance with another embodiment of the disclosure. The NOR memory array 300 includes access lines (e.g., word lines) $302_1$ to $302_P$ and intersecting local digit lines $304_1$ to $304_Q$. For ease of addressing in the digital environment, the number of access lines 302 and the number of digit lines 304 typically are each some power of two. The local digit lines 304 are coupled to global digit lines (not shown) in a many-to-one relationship, such as a wire- or configuration.

Charge-storage transistors 308 are located at each intersection of an access line 302 and a local digit line 304. The charge-storage transistors 308 represent non-volatile memory cells for storage of data. Construction of charge-storage transistors 308 includes a source 310 and a drain 312, a charge-storage node 314, and a control gate 316, as shown in FIG. 3. The charge-storage transistors 308 can be formed in accordance with one or more of the various embodiments.

The charge-storage transistors 308 having their control gates 316 coupled to an access line 302 typically share a common source depicted as an array source 318. As shown in FIG. 3, the floating-gate transistors 308 coupled to two adjacent access lines 302 may share the same array source 318. The charge-storage transistors 308 have their drains 312 coupled to a local digit line 304. A column of the charge-storage transistors 308 includes those transistors commonly coupled to a given local digit line 304. A row of the charge-storage transistors 308 includes those transistors commonly coupled to a given access line 302.

To reduce problems associated with high resistance levels, the array source 318, for example, may be regularly coupled to a metal or other highly conductive line to provide a low-resistance path to ground. The array ground 320 serves as this low-resistance path.

FIGS. 4A-4D are cross-sectional views at various process steps of formation of a memory cell 400 (depicted as 400A in FIG. 4C and 400B in FIG. 4D) in accordance with one or more embodiments of the disclosure. A gate stack can be formed on a semiconductor, such as substrate 410. The gate stack includes a tunnel dielectric 420, a charge storage node 435, an inter-gate dielectric 450 over the charge storage node 435, and a control gate 460 over the inter-gate dielectric 450.

For one embodiment, the substrate 410 is a mono-crystalline silicon substrate 410. For a further embodiment, the substrate 410 is a p-type mono-crystalline silicon substrate 410. In still other embodiments, the substrate may include materials such as $SiO_2$, SiON, a polysilicon.

The tunnel dielectric 420 (may also be referred to as a gate dielectric) is formed over an active region (also referred to herein as a channel region) 415 of the substrate 410, over which memory cells will be formed. The gate dielectric 420 might be formed by thermal oxidation of the substrate 410. Alternatively, the gate dielectric 420 could be formed by a blanket deposition of a dielectric material, such as by chemical vapor deposition (CVD) or physical vapor deposition (PVD).

The gate dielectric 420 may comprise any suitable composition or combination of compositions, and may, for example, include one or more of silicon dioxide and various lanthanide oxides. As non-limiting examples, the gate dielectric 420 may contain silicon oxide ($SiO_2$), but may alternatively or additionally include high-K dielectrics such as $HfO_2$, $ZrO_2$, $Al_2O_3$, etc. High-K dielectrics are generally considered to be dielectrics with a dielectric constant greater than that of $SiO_2$. The tunnel dielectric material may be formed to an equivalent silicon dioxide thickness of from about 1 nanometer to about 7 nanometers.

The charge storage node 435 can include a plurality of discrete islands 430 of charge-trapping material. The charge storage node 435 may be one or more layers capable of storing a charge indicative of a data state of the memory cell 400. The islands 430 are illustrated to comprise electrically conductive material, such as metal, but in other embodiments at least some of the islands 430 may comprise charge-trapping dielectric material. The islands 430 may correspond to nanocrystals of nanoparticles (such as, for example, nanodots 430). For the most part, the islands 430 are referred to herein as nanodots 430 and refer to discrete islands 430. As a non-limiting example, the nanodots 430 may have a size of about 15 angstroms and a relative spacing between nanodots 430 of about 15 angstroms. While illustrated with the same size and spacing in FIGS. 4A-4D, the nanodots 430 may be a variety of sizes and have a variety of relative spacing. In some embodiments, the nanodots 430 may have maximal cross-sectional dimensions of from about 1 nanometer to about 50 nanometers. Furthermore, while discrete islands are focused on in this description, the charge storage node 435 may comprise a semi-continuous or continuous layer of a material such as, for example, Ruthenium.

These isolated nanodots 430 serve to store charge and can thus collectively be thought of as a charge storage node 435 in a memory cell. For some embodiments, the nanocrystals contain a metal component. For example, the nanocrystals may be formed of conductive metal nitrides or metal oxides, such as conductive refractory metal nitrides or conductive refractory metal oxides. In one embodiment, the nanocrystals are Ruthenium. As other examples, nanocrystals can be doped semiconductors (e.g., doped Ge or Si), metals (e.g., Ru, Re, Pt), metal nitrides (TiN, TaN), metal oxides (e.g., RuOx), metal alloys (e.g., RuAl, RuTi), metal-alloy-nitrides (e.g., ternary nitrides like RuAlN, TaAlN), or ruthenium rare earth combination RuRe (e.g., Lanthanum). These nanocrystals may be formed by using specific precursors to control the nanocrystal density during ALD. However, other molecular structures could be used in the charge storage node 435 provided the resulting nanocrystals serve as charge-storage sites within the bulk material.

While illustrated as a single layer of nanodots 430, those of ordinary skill in the art will recognize that embodiments of the disclosure may include charge storage nodes comprising multiple layers of nanodots 430 separated by dielectric material.

In general, the nanocrystal structures are formed of conductive materials over which a protective film 440 is formed, as is explained more fully below. As non-limiting examples, the protective film 440 may be formed to coat, encase, or encapsulate the nanocrystal structures.

An inter-gate dielectric 450 (may also be referred to as a blocking dielectric) may be formed over the charge storage node 435 and includes a dielectric material. For one embodiment, the inter-gate dielectric 450 contains silicon oxide ($SiO_2$), but may alternatively or additionally include high-K dielectrics such as hafnium oxide ($HfO_2$), zirconium oxide ($ZrO_2$), aluminum oxide ($Al_2O_3$), aluminum hafnium oxide (AlHfOx), etc.

As non-limiting examples, the nanodots 430 may be formed by deposition of a thin film (specifically, a film of thickness of from about 1 nanometer to about 1.2 nanometers) followed by e-beam evaporation, by co-sputtering metal with embedding insulator, by pulsed nucleation and/or by a templated self-assembly. As another non-limiting examples, the nanodots 430 may be formed by using atomic layer deposition (ALD) and halting the process before it forms a continuous layer (i.e., while the islands 430 are in a discontinuous form).

A control gate 460 is formed over the inter-gate dielectric 450. The control gate 460 is generally one or more layers of conductive material. As non-limiting examples, the control gate 460 may include a conductively-doped polysilicon or a metal-containing layer over a polysilicon layer (e.g., a refractory metal silicide layer formed on a conductively-doped polysilicon layer). The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. As other examples, the control gate 460 may include multiple metal-containing layers, e.g., a titanium nitride (TiN) barrier layer over the inter-gate dielectric 450, a titanium (Ti) adhesion layer over the barrier layer and a tungsten (W) layer over the adhesion layer.

Source regions 490 and drain regions 490 are formed in or on the substrate 410 generally adjacent the gate dielectric 420. A channel region 415 of the memory cell 400 is defined by the area of the substrate 410 between the source/drain regions 490. The source/drain regions 490 will generally have a conductivity type opposite the conductivity type of the substrate 410. For example, for a p-type substrate 410, the source/drain regions 490 might have an n+-type conductivity.

Figure 4A:
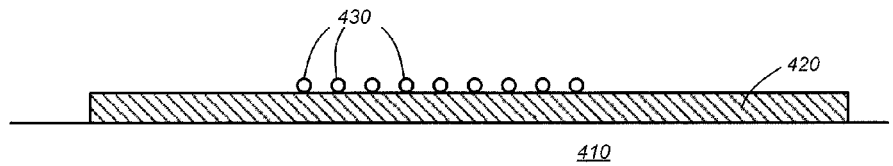
FIGS. 4A-4D are simplified cross-sectional views at various process steps during formation of a memory cell in accordance with one or more embodiments of the disclosure.

In summary of FIGS. 4A-4D, in FIG. 4A, construction is shown at a processing stage in which tunnel dielectric 420 is formed across the substrate 410, and the nanodots 430 are formed over the tunnel dielectric 420.

Figure 4B:
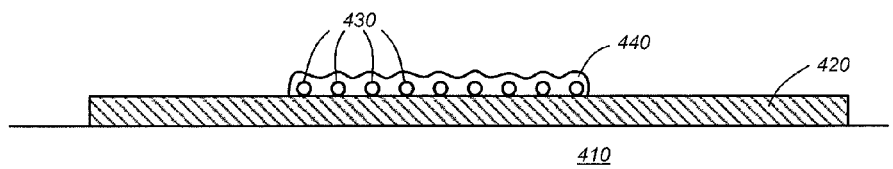

In FIG. 4B, a protective film 440 is formed over the nanodots 430 and the dielectric material 420, as is explained below.

Figure 4C:
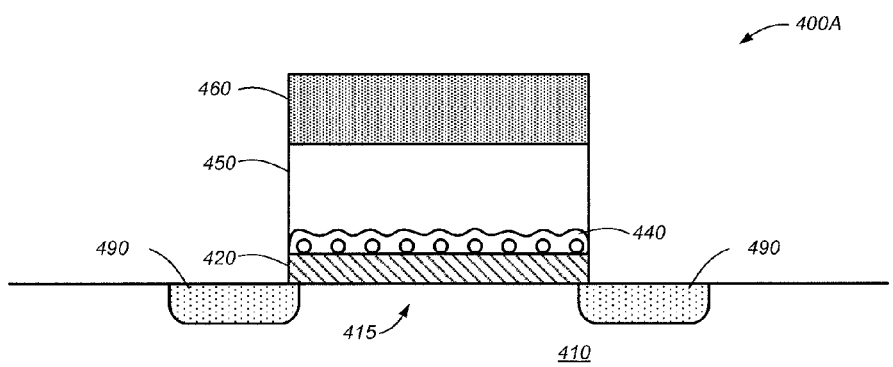

In FIG. 4C, inter-gate dielectric 450 is formed over the nanodots 430 and protective film 440, and the control gate 460 is formed over the inter-gate dielectric 450.

Figure 4D:
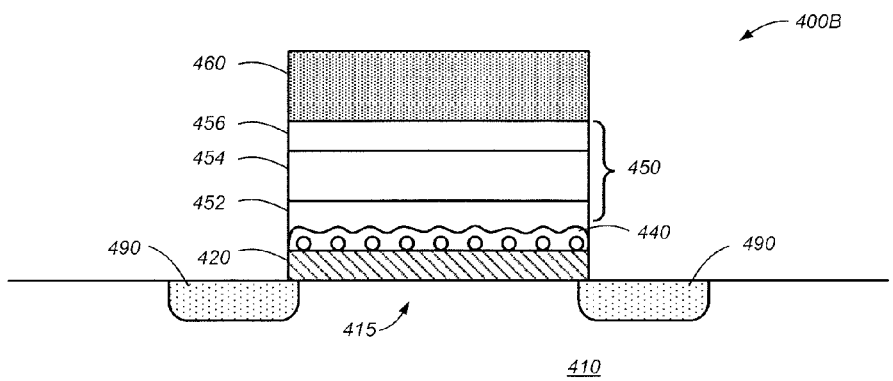

In FIG. 4D, inter-gate dielectric 450 is formed as multiple layers 452, 454, and 456 over the nanodots 430 and protective film 440, as explained more fully below. The control gate 460 is formed over the inter-gate dielectric 450.

The gate stack may be patterned to define access lines (i.e., word lines) of a memory device. It is noted that additional layers may form the gate stack, such as barrier layers to inhibit diffusion between opposing layers or adhesion layers to promote adhesion between opposing layers. Sidewall spacers may be formed on the sidewalls of the gate stacks to protect and insulate the sidewalls.

In one or more embodiments of the present invention, the nanodots 430 may need to be protected from the formation of the inter-gate dielectric 450. For example, the nanodots 430 may be formed as ruthenium nanodots 430 and the inter-gate dielectric 450 may be formed of high-k dielectric formed with an ALD process including $O_3$ as one of the precursors (also referred to herein as $O_3$-based high-k dielectric). As a non-limiting example, the $O_3$-based high-k dielectric may be HfSiOx. $O_3$-based high-k dielectric formation may react with the ruthenium nanodots 430 to form ruthenium tetroxide (RuO4), which can be very volatile. As a result, this process may completely or partially vaporize the nanodots 430, which may eliminate too many nanodots 430, make the nanodots 430 too small, or completely remove the nanodots 430.

To fortify the ruthenium nanodots 430, or other nanodot materials susceptible to a damaging reaction with $O_3$-based high-k dielectric formation, the protective film 440 may be formed over the nanodots 430.

In some embodiments, the protective film 440 may be formed by subjecting the ruthenium nanodots 430 to an $O_2$ presoak at a high temperature, such as, for example, about 600° C. Exposure to $O_2$ at a high temperature will form ruthenium dioxide ($RuO_2$), which is more stable than the volatile $RuO_4$. After the oxidation with $O_2$, the protective film 440 will include $RuO_2$ as a coating of ruthenium dioxide for the ruthenium nanodots 430. The $RuO_2$ coating is not as reactive with $O_3$-based high-k dielectric formation and fortifies the ruthenium nanodots 430 against subsequent harmful reactions with $O_3$. In other embodiments, the nanodots may be formed of materials such as RuHf and RuSi, which are then subjected to the $O_2$ presoak at a high temperature.

In some embodiments, the nanodots may be formed with an alloy of ruthenium and another material such as, for example, strontium. A SrRu alloy may be less susceptible to damage and vaporization from the formation of $O_3$-based high-k dielectrics. The alloyed nanodots may be formed through computer PVD, PVD from a SrRu target, concurrent PVD of Ru and Sr, a CVD process, or other process to deposit both Sr and Ru on the surface for formation of nanodots. In addition, the SrRu nanodots may be oxidized to create $SrRuO_3$, which may be even less susceptible to damage and vaporization from the formation of $O_3$-based high-k dielectrics. As another non-limiting example, RuSr may formed with consecutive PVD of Ru and then Sr.

In other embodiments, rather than forming a protective film, the ruthenium nanodots 430 may be formed with a larger size, increased density, or a combination thereof prior to formation of the $O_3$-based high-k dielectric.

Figure 5A:
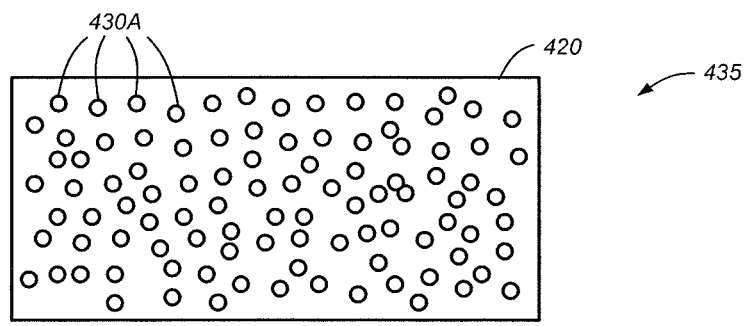
FIGS. 5A and 5B are simplified plan views of nanodots of a charge storage node before and after, respectively, a process of forming high-k dielectric material over the nanodots.
Figure 5B:
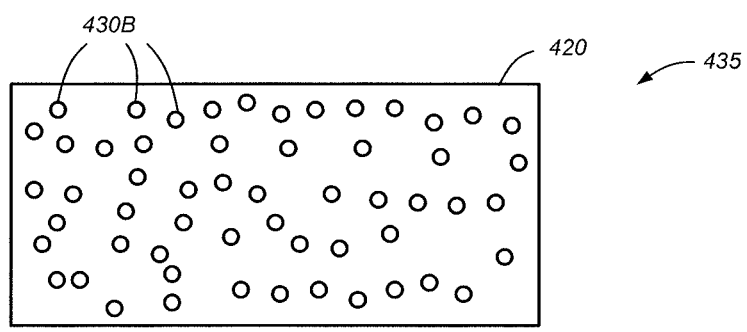

FIGS. 5A and 5B are simplified plan views of nanodots 430 of a charge storage node 435 before and after, respectively, a process of forming high-k dielectric material over the nanodots 430. In FIG. 5A the ruthenium nanodots 430A are shown with an increased density on the gate dielectric 420 to create an overabundance of nanodots 430A relative to a desired nanodot density. When exposed to the formation of high-k dielectric material some of these nanodots may vaporize or reduce in size. In FIG. 5B the ruthenium nanodots 430B are shown with a desired nanodot density on the gate dielectric 420 after some of the ruthenium nanodots 430A have vaporized. As a non-limiting example a desired nanodot density may be about $5E12/cm^2$.

In other embodiments, the protective film 440 may be formed by an ALD process using a water-based high-K dielectric. The ALD process includes an alternating series of self-limiting chemical reactions, called half-reactions, between gas-phase precursors and a substrate. The precursors are pulsed into the reactor in a sequential fashion, with purging of precursors in between. A series of these pulse/purge/pulse/purge cycles are used to form a continuous layer of material.

FIGS. 6A-6D depict conceptually an atomic layer deposition process on a substrate 605. The discussion of 6A-6D is a generic description that may apply to forming many of the layers described herein, such as, for example, the tunnel dielectric 420, the charge storage node 435, the protective film 440 and high-k dielectric layers. Note that no attempt has been made to represent specific molecular structures. However, the concepts of ALD as they relate to the present disclosure will be aided by FIGS. 6A-6D. Reference may be made to all of FIGS. 6A-6D when individually describing each of FIGS. 6A-6D.

In ALD, gaseous precursors are introduced one at a time to the substrate surface mounted within a reactor (e.g., a reaction chamber). This introduction of the gaseous precursors takes the form of sequential pulses of each gaseous precursor. In a pulse of a precursor gas, the precursor gas is made to flow into a specific area or region for a short period of time. Between the pulses, the reaction chamber is purged with a gas (e.g., an inert gas), evacuated, or a combination thereof. The first precursor material to be introduced may be called the precursor, and the next material introduced may be called the reactant, but both materials are precursors to the eventual material formed by the ALD reaction, and thus both will be referred to herein as precursors.

Figure 6A:
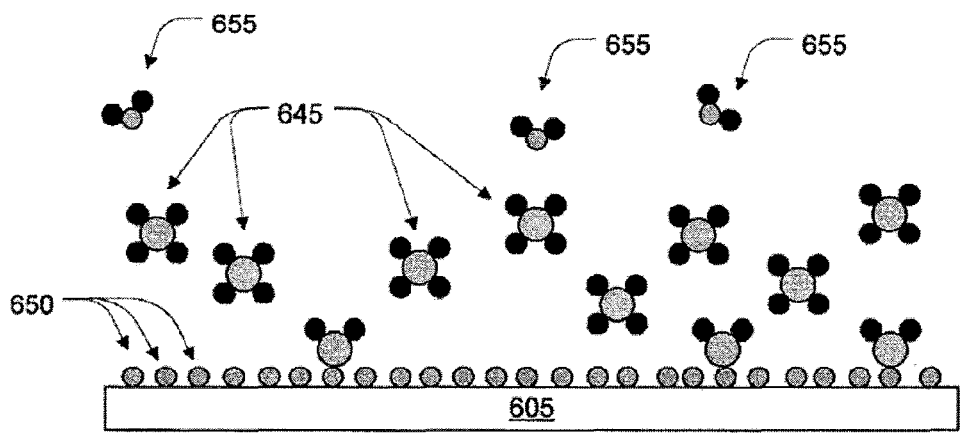
FIGS. 6A-6D conceptually depict an atomic layer deposition process in accordance with an embodiment of the disclosure.

In FIG. 6A, a first precursor 645 is introduced into the reactor and a portion is chemisorbed at a surface of the substrate 410 during the first pulsing phase. Typically, the first precursor 645 is chemisorbed at an adsorption site 650 of the surface, such as absorbed hydroxyl sites resulting from exposure of the substrate 410 to water vapor. However, the surface treatment for creation of adsorption sites 650 will be dependent upon the chosen precursors. The reactor is then purged or evacuated to remove excess first precursor 645 (i.e., the first precursor 645 that has not been chemisorbed onto the adsorption sites 650) and reaction products 655.

Figure 6B:
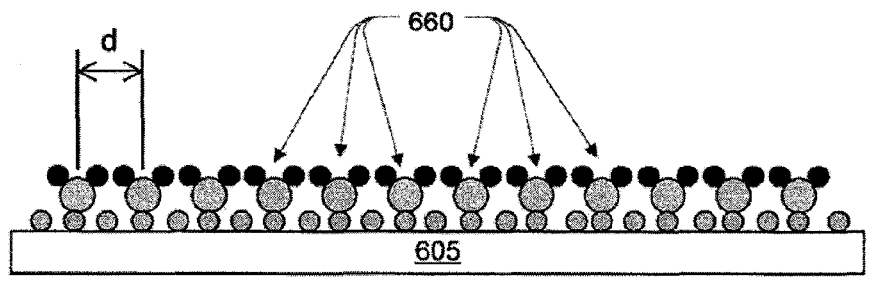

As shown in FIG. 6B, the chemisorbed first precursor 645 results in reaction sites 660 for a subsequent phase of the ALD process. Spacing "d" represents the minimum distance between adjacent molecules of the first precursor controlled by the steric hindrance of those molecules. Thus, larger molecules may not be able to make use of each potential adsorption site 650. In the usual application of the ALD processes, the spacing d is desired to be close to the inter-atomic spacing of the deposited film, thereby enabling surface saturation which leads to an ideal 2-dimensional layer-by-layer growth. Therefore in the usual instances of the ALD application, large precursors are undesirable due to the resulting non-planarity and slow rate of growth. In some layers (e.g., the charge storage node 435), the choice of larger-sized precursors, in conjunction with proper substrate treatment to provide adsorption sites 650 suitable for the chosen precursor, would exploit this "non-ideality" of the larger precursor sizes to help facilitate a desirable 3-dimensional growth of nanometer-sized "islands." However, regardless of the molecular size of the precursors, imperfections of the surface of the substrate 410 may also produce discontinuities in the resulting layer. Typical ALD processing overcomes these imperfections by performing multiple cycles until a continuous layer is formed, if desired.

Figure 6C:
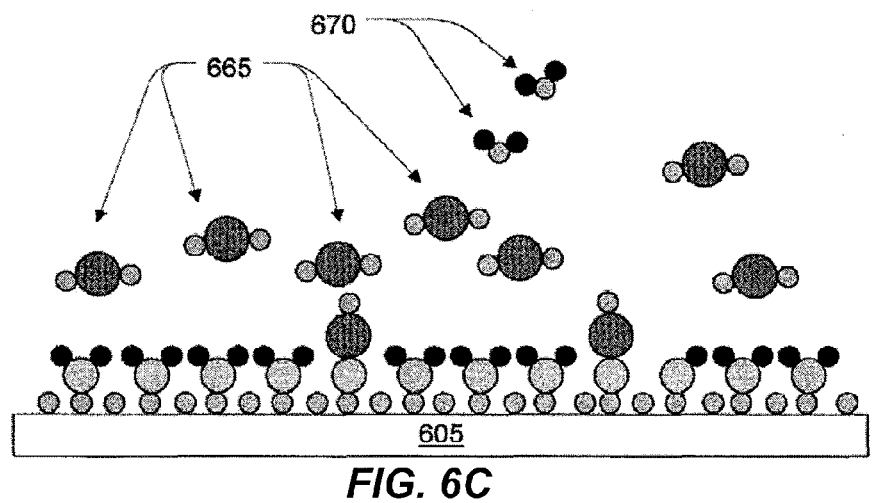

In FIG. 6C, a second precursor 665 is introduced into the reactor and a portion reacts with the first precursor 645 at the reaction sites 660 during the second pulsing phase. The reactor is then purged or evacuated to remove excess second precursor 665 (i.e., the second precursor 665 that has not reacted with the first precursor 645 at reaction sites 660) and reaction products 670.

Figure 6D:
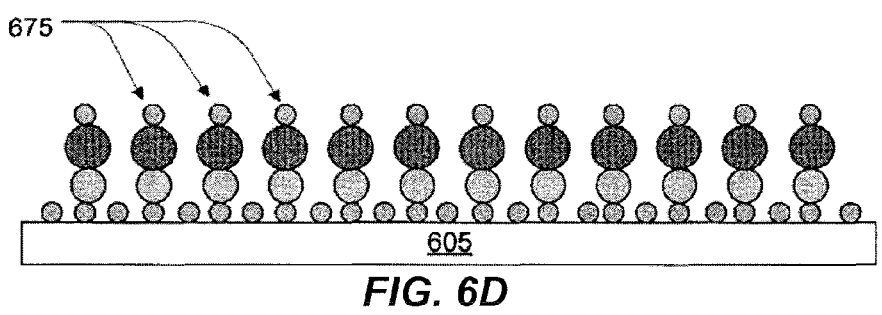

As shown in FIG. 6D, following the reaction of the second precursor 665 with the first precursor 645 at the reaction sites 660, adsorption sites 675 are formed for chemisorbing additional first precursor 645 in a subsequent cycle of the ALD process. A number of cycles of the phases of FIGS. 6A-6D can be performed. However, in accordance with some embodiments of the disclosure, and related to the formation of the charge storing node, the number of cycles may be limited to a number that does not result in a continuous film.

Figure 7:
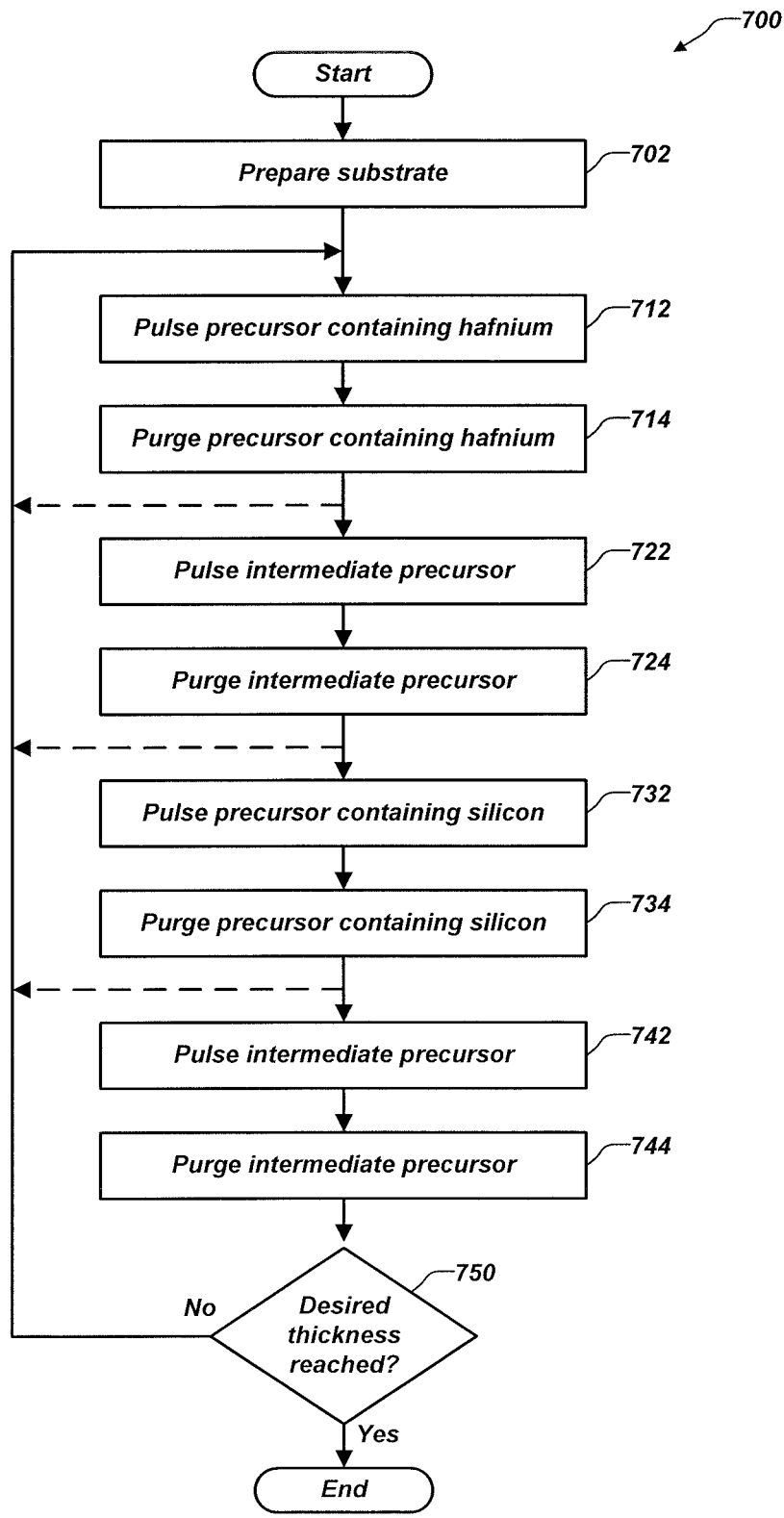
FIG. 7 is a simplified flow diagram showing acts involved in forming a protective film over nanodots.

FIG. 7 is a simplified flow diagram showing a process 700 with acts involved in forming a protective film 440 over nanodots 430. When discussing FIG. 7, reference will also be made to FIGS. 4A-4D. The protective film 440 may include a number of water-based materials, such as, for example, HfOx, ALOx, ZrOx. As other non-limiting examples, the protective film 440 may include ALD formed to include one or more of the dielectrics SiN, $SiO_2$, dielectrics formed with hydrogen peroxide solutions, dielectrics formed with ammonia solutions, and dielectrics formed with generated water ($H_2/O_2$ mixtures) systems. For simplicity of explanation, and not limitation, the discussion of FIG. 7 will focus on a water-based formation of HfSiOx as the protective film 440. With the discussion of FIG. 7, and an understanding of ALD processes, those of ordinary skill in the art will understand the formation of other protective films. Some example materials for other protective films include metal-alloys, metal-alloy suboxides, and metal-alloy oxides, such as, RuSi, RuSiOx, $RuSiO_4$, RuHf, RuHfOx, and $RuHfO_4$.

In operation 702, the substrate 410 is prepared for the ALD process. For the case of forming the protective film 440, the substrate would include the gate dielectric 420 and nanodots 430. In some embodiments, the substrate 440 may include Hf, Si, or $H_2O$ at the beginning of the process. Furthermore, while the discussion starts with a hafnium precursor, in other embodiments the process may begin with, for example, silicon.

In operation 712 a hafnium precursor is pulsed into the reaction chamber to form a layer over the substrate 410. In operation 714, the hafnium precursor is purged from the reaction chamber.

In operation 722 an intermediate precursor (e.g., $H_2O$) is pulsed into the reaction chamber to form a layer over the substrate 410. In operation 724, the intermediate precursor is purged from the reaction chamber.

In operation 732 a silicon-containing precursor is pulsed into the reaction chamber to form a layer over the substrate 410. In operation 734, the silicon-containing precursor is purged from the reaction chamber.

In operation 742 the intermediate precursor is pulsed into the reaction chamber to form a layer over the substrate 410. In operation 744, the intermediate precursor is purged from the reaction chamber.

Decision block 750 determines if more ALD cycles should be applied to achieve a desired thickness for the protective film 440. For example, for HfSiOx using water as the oxidizer, the protective film may have a nominal thickness of about 6 angstroms, which may amount to about eight cycles of the ALD process. For HfSiOx, the protective film may have a range of about 2 to 10 angstroms.

The protective film 440 may not have dielectric characteristics that are as desirable as those of $O_3$-based high-k dielectrics. Therefore, the protective film 440 may be very thin so that better $O_3$-based high-k dielectrics may be applied over the protective film 440. On the other hand, the protective film 440 should be thick enough to fortify the nanodots 430 against vaporization or damage due to the $O_3$-based high-k dielectrics.

If the desired thickness for the protective film 440 has not been reached, the process continues with another cycle of ALD. If the desired thickness for the protective film 440 has been reached, the process ends.

In general, the process 700 describes formation of HfSiOx in a one-to-one ratio. However, other ratios may be formed, such as, for example, a Hf-rich ratio. The dashed lines after each of the purge operations (714, 724, and 734) indicate that the process 700 may loop back at these point to create ratios different from one-to-one. After formation of the protective film, the inter-gate dielectric 450 may be formed. Furthermore, these $H_2O$ based interface layers may be of relatively low quality and grown at low temperatures, down to room temperature. Subsequently, before forming the rest of the dielectric, the quality of the $H_2O$ based interface layers may be improved through any number of processes, such as, for example, high temperature anneal and plasma induced nitridation. Other suitable treatments to improve the oxygen diffusion barrier effectiveness of the $H_2O$ based interface layers may include incorporating other oxidants such as Fluorine.

Figure 8:
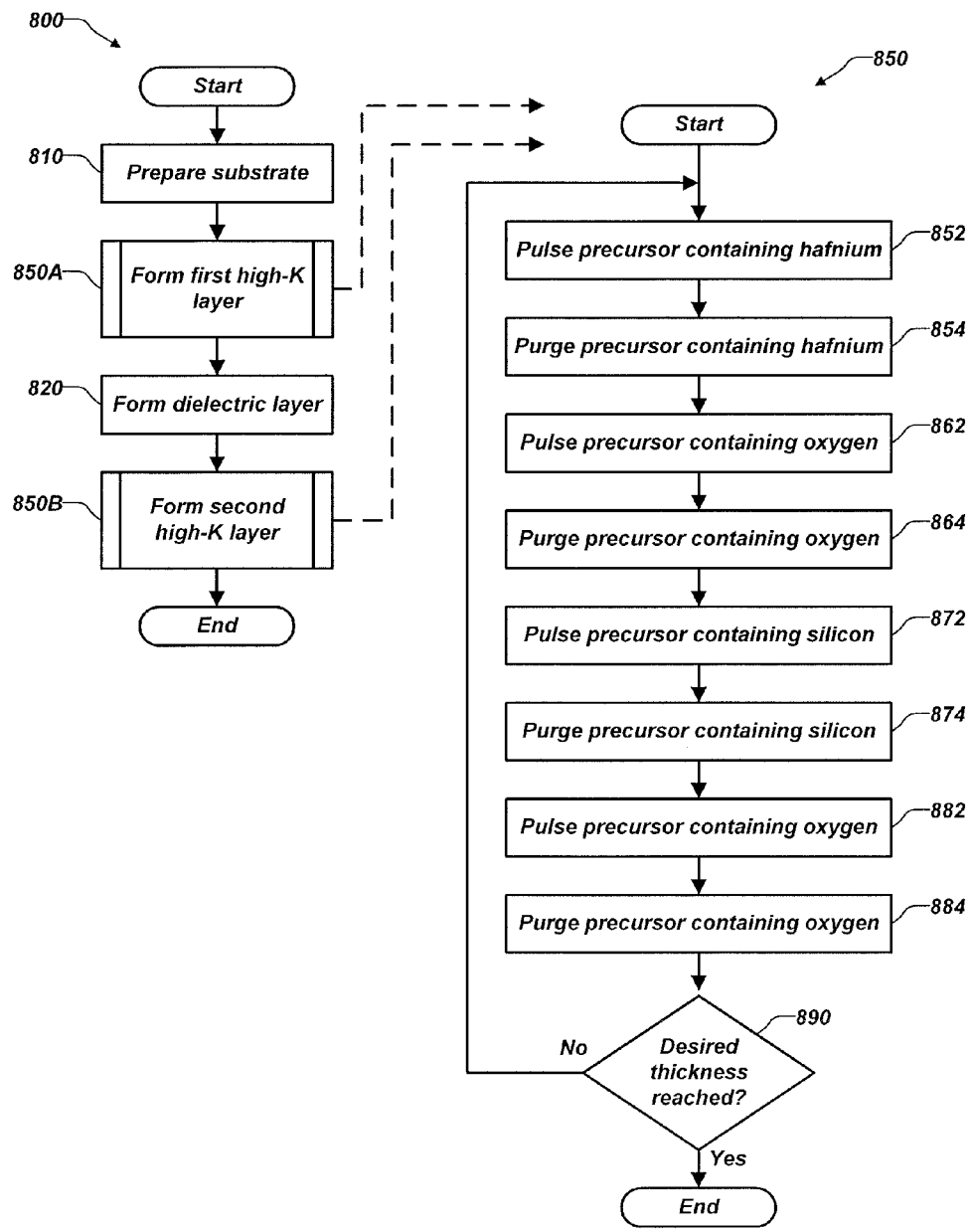
FIG. 8 is a simplified flow diagram showing acts involved in forming inter-gate dielectric including high-k dielectric material.

FIG. 8 is a simplified flow diagram showing a process 800 with acts involved in forming the inter-gate dielectric 450 including high-k dielectric material.

When discussing FIG. 8, reference will also be made to FIGS. 4A-4D. The inter-gate dielectric 450 may include a number of high-k dielectric materials, such as, for example, one or more of zirconium oxide (ZrO), silicon aluminum oxynitride (SiAlON), aluminum hafnium oxynitride (AlHfON), silicon tantalum oxynitride (SiTaON), aluminum tantalum oxynitride (AlTaON), zirconium silicon oxynitride (ZrSiON), lanthanide silicon oxynitride (for instance, LaSiON), and lanthanide aluminum oxynitride (for instance, LaAlON). The chemical formulas are shown to illustrate the elements comprised by the compounds, rather than to illustrate stoichiometric relationships of the elements.

In operation 810, the substrate 410 is prepared for the ALD process. For the case of forming the inter-gate dielectric 450, the substrate could include the gate dielectric 420, the nanodots 430, and, if present, the protective film 430.

In operation 850A, a first $O_3$-based high-k dielectric is formed. Operations 850A and 850B are generically illustrated as process 850. Process 850 begins with operation 852.

In operation 852 a hafnium precursor is pulsed into the reaction chamber to form a layer over the substrate 410. In operation 854, the hafnium precursor is purged from the reaction chamber.

In operation 862 an oxygen-containing precursor (e.g., $O_3$) is pulsed into the reaction chamber to form a layer over the substrate 410. In operation 864, the oxygen-containing precursor is purged from the reaction chamber.

In operation 872 a silicon-containing precursor is pulsed into the reaction chamber to form a layer over the substrate 410. In operation 874, the silicon-containing precursor is purged from the reaction chamber.

In operation 882 the oxygen-containing precursor is pulsed into the reaction chamber to form a layer over the substrate 410. In operation 884, the oxygen-containing precursor is purged from the reaction chamber.

Decision block 890 determines if more ALD cycles should be applied to achieve a desired thickness for the $O_3$-based high-k dielectric. As an example, when the inter-gate dielectric 450 includes the first $O_3$-based high-k dielectric, an intermediate dielectric, and a second $O_3$-based high-k dielectric, a desired thickness for the first $O_3$-based high-k dielectric may have a nominal thickness of about 60 angstroms and a range of about 10 to 100 angstroms.

If the desired thickness for the $O_3$-based high-k dielectric has not been reached the process continues with another cycle of ALD. If the desired thickness for the $O_3$-based high-k dielectric has been reached, process 850 ends and control returns to process 800.

In some embodiments, only some of the inter-gate dielectric 450 is high-k dielectric material, and the remaining dielectric material may include any suitable dielectric composition, such as silicon dioxide. In other embodiments the inter-gate dielectric 450 may include only high-k dielectric material. Thus, the inter-gate dielectric 450 may be a single material as illustrated in FIG. 4C, two layers including high-k dielectric material and an intermediate dielectric (not shown), or three layers including the first $O_3$-based high-k dielectric, the intermediate dielectric, and the second $O_3$-based high-k dielectric.

If an intermediate dielectric is desired, operation 820 is performed to form this intermediate layer on the first high-k dielectric. A desired thickness for the intermediate dielectric may have a nominal thickness of about 80 angstroms and a range of about 40 to 150 angstroms If a second high-k dielectric is desired, operation 850B is performed, which repeats process 850 to form the second high-k dielectric. A desired thickness for the second $O_3$-based high-k dielectric may have a nominal thickness of about 60 angstroms and a range of about 10 to 100 angstroms.

CONCLUSION

Embodiments of the present invention may include devices and methods of forming the devices that include fortified nanodots protected from damage, vaporization, or a combination thereof due to high-k dielectrics formed over the nanodots.

In some embodiments, a method of forming a floating gate includes forming a dielectric over a semiconductor and forming nanodots over portions of the dielectric to develop charge trap regions where the nanodots are formed. The nanodots are encased with a protective film comprising a water-based dielectric formed over the nanodots and the dielectric. A high-k dielectric is formed over the protective film.

In other embodiments, a method of forming a charge trap memory cell includes forming a tunnel oxide over a substrate. Floating charge-trap gates are formed over the tunnel oxide by forming nanodots on the tunnel oxide and forming a thin film of a protection layer over the nanodots and the tunnel oxide. An inter-gate dielectric, which includes an $O_3$-based high-k dielectric, is formed over the protection layer and a control gate is formed over the inter-gate dielectric and the floating charge-trap gates.

In other embodiments, a method of forming a charge trap region includes forming a dielectric and forming ruthenium nanodots on the dielectric. The ruthenium nanodots are oxidized at a temperature above about 600° C. to form a coating of ruthenium dioxide on the ruthenium nanodots. An $O_3$-based high-k dielectric is formed over the coating of ruthenium dioxide and the dielectric.

In yet other embodiments, a method of forming a floating gate includes forming a dielectric over a semiconductor and forming ruthenium nanodots on the dielectric. The ruthenium nanodots are doped with an additional material to form a ruthenium alloy at least on a surface of the ruthenium nanodots and an $O_3$-based high-k dielectric is formed over the ruthenium nanodots and the dielectric.

In yet other embodiments, a method of forming a floating gate includes forming a dielectric over a semiconductor and forming an overabundance of ruthenium nanodots on the dielectric at a nanodot density that is higher than a desired nanodot density. An $O_3$-based high-k dielectric is formed over the overabundance of the ruthenium nanodots and some of the ruthenium nanodots vaporize during the formation of the $O_3$-based high-k dielectric to produce the desired nanodot density.

In yet other embodiments, a memory device includes an array of memory cells. At least one of the memory cells includes a tunnel dielectric, a charge storage node comprising nanodots over the tunnel dielectric, and a protective film over the nanodots. The at least one memory cell also includes an inter-gate dielectric over the protective film and a control gate over the inter-gate dielectric. The protective film is configured to protect at least some of the nanodots from vaporizing during formation of the inter-gate dielectric.

In yet other embodiments, a memory device includes an array of memory cells. At least one of the memory cells includes a tunnel dielectric and a charge storage node including nanodots over the tunnel dielectric, wherein the nanodots comprise an alloy of ruthenium and strontium. The at least one memory cell also includes an inter-gate dielectric over the charge storage node and a control gate over the inter-gate dielectric. The alloy of ruthenium and strontium is configured to protect at least some of the nanodots from vaporizing during formation of the inter-gate dielectric.

Although the present invention has been described with reference to particular embodiments, the present invention is not limited to these described embodiments. Rather, the present invention is limited only by the appended claims and their legal equivalents.

What is claimed is:

1. A method of forming a memory cell, comprising:
   forming a dielectric over a semiconductor;
   forming a charge-trapping material over the dielectric;
   forming a protective film over at least a portion of the charge-trapping material, wherein the protective film comprises at least one of a dielectric formed with a hydrogen peroxide, or a dielectric formed with an ammonia; and
   forming a high-k dielectric over the charge-trapping material.

2. A method of forming a memory cell, comprising:
   forming a dielectric over a semiconductor;
   forming a charge-trapping material comprising forming nanocrystals of nanoparticles;
   forming nanocrystals of nanoparticles comprises forming nanodots;
   forming nanodots comprises forming nanodots containing a metal component;
   forming nanodots containing a metal component comprises forming nanodots formed of at least one of conductive metal nitrides, metal oxides, metals, metal alloys, or metal-alloy-nitrides;
   oxidizing at least a portion of the charge-trapping material; and
   forming a high-k dielectric over the charge-trapping material.

3. A method of forming a memory cell, comprising:
   forming a dielectric over a semiconductor;
   forming a charge-trapping material over the dielectric using a chemical vapor deposition process, a physical vapor deposition process or an atomic layer deposition process;
   oxidizing at least a portion of the charge-trapping material; and
   forming a high-k dielectric over the charge-trapping material.

4. A method of forming a memory cell, comprising:
   forming a dielectric over a semiconductor;
   forming a charge-trapping material over the dielectric;
   oxidizing at least a portion of the charge-trapping material by subjecting the charge-trapping material to an $O_2$ presoak at a high temperature; and
   forming a high-k dielectric over the charge-trapping material.

5. The method of claim 2, wherein oxidizing at least a portion of the charge-trapping material comprises forming $RuO_2$, SrRu, SrO, or $SrRuO_3$.

6. The method of claim 1, further comprising forming the charge-trapping material including at least one of ruthenium, rhenium, rhodium, platinum, titanium nitride, tantalum nitride, ruthenium oxide, ruthenium hafnium, ruthenium silicon, ruthenium aluminum alloy, ruthenium titanium alloy, ruthenium aluminum nitride, tantalum aluminum nitride, or strontium ruthenium alloy.

7. A method of forming a memory cell, comprising:
forming a dielectric over a semiconductor;
forming a charge storage structure comprising a charge-trapping material over the dielectric;
forming a water-based dielectric over the charge-trapping material;
forming an inter-gate dielectric over the water-based dielectric; and
forming a control gate over the inter-gate dielectric.

8. The method of claim 7, wherein forming the water-based dielectric comprises using an atomic layer deposition process, comprising:
performing an atomic layer deposition cycle, comprising:
introducing a hafnium-containing precursor into a reactor containing the semiconductor;
introducing a water-based precursor into the reactor;
introducing a silicon-containing precursor into the reactor; and
introducing the water-based precursor into the reactor;
wherein each precursor is independently introduced and the reactor is purged, evacuated, or a combination thereof between each introduction of the precursors; and
repeating the performing the atomic layer deposition cycle if necessary to form a desired thickness for the water-based dielectric.

9. The method of claim 8, wherein repeating the performing the atomic layer deposition cycle comprises forming the water-based dielectric to a desired thickness of between about 2 angstroms and about 10 angstroms.

10. The method of claim 8, further comprising treating the water-based dielectric film after the repeating with a high temperature anneal, a nitridation process, a process to improve an oxygen diffusion barrier property of the water-based dielectric, or a process to improve a charge leakage barrier property of the water-based dielectric.

11. The method of claim 7, wherein the charge storage structure is formed using a chemical vapor deposition process, a physical vapor deposition process or an atomic layer deposition process.

12. The method of claim 7, wherein forming the inter-gate dielectric comprises forming a high-k dielectric by:
forming a first high-k layer using an atomic layer deposition process, comprising:
performing an atomic layer deposition cycle, comprising:
introducing a hafnium-containing precursor into a reactor containing the semiconductor;
introducing an oxygen-containing precursor into the reactor;
introducing a silicon-containing precursor into the reactor; and
introducing the oxygen-containing precursor into the reactor;
wherein each precursor is independently introduced and the reactor is purged, evacuated, or a combination thereof between each pulsing of the precursors; and
repeating the performing the atomic layer deposition cycle to form a first desired thickness.

13. The method of claim 12, further comprising:
forming an intermediate dielectric over the first high-k layer; and
forming a second high-k layer over the intermediate dielectric layer by repeating the performing the atomic layer deposition cycle to form a second desired thickness.

14. A method of forming a memory cell, comprising:
forming a tunnel dielectric over a substrate;
forming a charge storage structure over the tunnel dielectric by:
forming nanodots over the tunnel dielectric; and
forming a protection film over the nanodots, wherein the protection film comprises at least one of a dielectric formed with a hydrogen peroxide, or a dielectric formed with an ammonia;
forming an $O_3$-based high-k inter-gate dielectric over the protection film; and
forming a control gate over the inter-gate dielectric.

15. The method of claim 14, further comprising forming the nanodots to comprise at least one of ruthenium, rhenium, rhodium, platinum, titanium nitride, tantalum nitride, ruthenium oxide, ruthenium aluminum alloy, ruthenium titanium alloy, ruthenium aluminum nitride, tantalum aluminum nitride, or ruthenium rare earth.

16. A method of forming a memory cell, comprising:
forming a tunnel dielectric over a substrate;
forming a charge storage structure over the tunnel dielectric by:
forming nanodots over the tunnel dielectric using a chemical vapor deposition process, a physical vapor deposition process or an atomic layer deposition process; and
forming a protection film over the nanodots;
forming an $O_3$-based high-k inter-gate dielectric over the protection film; and
forming a control gate over the inter-gate dielectric.

17. A method of forming a memory cell, comprising:
forming a tunnel dielectric over a substrate;
forming a charge storage structure over the tunnel dielectric by:
forming nanodots over the tunnel dielectric; and
forming a protection film over the nanodots;
forming an $O_3$-based high-k inter-gate dielectric over the protection film by:
forming a first $O_3$-based high-k dielectric over the protection film;
forming an intermediate dielectric over the first $O_3$-based high-k dielectric; and
forming a second $O_3$-based high-k dielectric over the intermediate dielectric; and
forming a control gate over the second $O_3$-based high-k dielectric.

18. A method of forming a charge storage structure, comprising:
forming a dielectric over a semiconductor;
forming nanodots over the dielectric, the nanodots comprising at least one of a nanodot density that is higher than desired and a nanodot size that is higher than desired; and
forming an $O_3$-based high-k dielectric over the nanodots;

wherein some of the nanodots vaporize, reduce in size, or a combination thereof during the forming the $O_3$-based high-k dielectric to produce at least one of a desired nanodot density and a desired nanodot size.

19. The method of claim 18, wherein forming the nanodots comprises forming ruthenium nanodots.

20. The method of claim 18, wherein the desired nanodot density is about $5E12/cm^2$.

* * * * *

UNITED STATES PATENT AND TRADEMARK OFFICE
CERTIFICATE OF CORRECTION

PATENT NO.          : 9,576,805 B2
APPLICATION NO.     : 14/667385
DATED               : February 21, 2017
INVENTOR(S)         : D. V. Nirmal Ramaswamy, Matthew N. Rocklein and Rhett T. Brewer It is certified that error appears in the above-identified patent and that said Letters Patent is hereby corrected as shown below:

In the Specification

| | | |
|---|---|---|
| Column 7, | Line 37, | change "(e.g., RuAl, RuTi)," to --(e.g., RuA1, RuTi),-- |
| Column 7, | Line 38, | change "RuAlN, TaAlN)," to --RuA1N, TaA1N),-- |
| Column 9, | Line 21, | change "computer PVD," to --cosputter PVD,-- |
| Column 9, | Line 45, | change "about 5El2/cm$^2$." to --about 5E12/cm$^2$.-- |

Signed and Sealed this
Fifth Day of September, 2017

Joseph Matal
*Performing the Functions and Duties of the*
*Under Secretary of Commerce for Intellectual Property and*
*Director of the United States Patent and Trademark Office*